United States Patent [19]

Mantese et al.

[11] Patent Number: 4,983,577
[45] Date of Patent: Jan. 8, 1991

[54] METALORGANIC DEPOSITION OF SUPERCONDUCTING YB-BA-CU-O THIN FILMS BY RAPID THERMAL ANNEALING

[75] Inventors: Joseph V. Mantese, Washington; Adolph L. Micheli, Mt. Clemens; Aboud H. Hamdi, Detroit, all of Mich.

[73] Assignee: General Motors Corporation, Detroit, Mich.

[21] Appl. No.: 136,585

[22] Filed: Dec. 22, 1987

[51] Int. Cl.$^5$ .............................................. B05D 5/12
[52] U.S. Cl. ...................................... 505/1; 505/734; 505/742; 427/62; 427/126.3; 427/226
[58] Field of Search ................ 427/62, 63, 226, 126.3; 106/311, 20; 505/1, 818, 819, 734, 742

[56] References Cited

U.S. PATENT DOCUMENTS

| | | | |
|---|---|---|---|
| 4,239,816 | 12/1980 | Breininger et al. | 427/168 |
| 4,292,347 | 9/1981 | Donley | 427/110 |
| 4,316,785 | 2/1982 | Suzuki et al. | 427/63 |
| 4,395,436 | 7/1983 | Bianchi et al. | 427/53.1 |
| 4,485,094 | 11/1984 | Pebler | 427/226 |

OTHER PUBLICATIONS

M. E. Gross et al., "Versatile New Metalorganic Process for Preparing Superconducting Thin Films," *Applied Physics Letters*, vol. 52, No. 2, Jan. 11, 1988, pp. 160–162.
C. E. Rice et al., "Preparation of Superconducting Thin Films of $Ba_2YCu_3O_7$ by a Novel Spin-On Pyrolysis Technique," *Applied Physics Letters*, vol. 51, No. 22, Nov. 30, 1987, pp. 1842–1844.
D. K. Lathrop et al., "Production of $YBa_2Cu_3O_{7-y}$ Superconducting Thin Films in situ by High Pressure Reactive Evaporation and Rapid Thermal Annealing," *Applied Physics Letters*, vol. 51, No. 19, Nov. 9, 1987, pp. 1554–1556.
M. K. Wu et al., "Superconductivity at 93K in a New Mixed-Phase Y-Ba-Cu-O Compound System at Ambient Pressure," *Physical Review Letters*, vol. 58, No. 9, Mar. 2, 1987, pp. 908–910.
H. Adachi et al., "Preparation and Characterization of Superconducting Y-Ba-Cu-O Thin Film," *Japanese Journal of Applied Physics*, vol. 26, No. 5, May 1987, pp. L709–L710.
D. Dijkkamp and T. Venkatesan, "Preparation of Y-Ba-Cu Oxide Superconductor Thin Films Using Pulsed Laser Evaporation from High T Bulk Material," *Applied Physics Letters*, vol. 51, No. 8, Aug. 24, 1987, pp. 619–621.
P. H. Hor et al., "Superconductivity above 90K in the Square-Planar Compound System $ABa_2Cu_3O_{6+x}$ with $A=Y$, La, Nd, Sm, Eu, Gd, Ho, Er, and Lu," *Physical Review Letters*, vol. 58, No. 18, May 4, 1987, pp. 1891–1884.
D. W. Murphy et al., "New Superconducting Cuprate Perovskites," *Physical Review Letters*, vol. 58, No. 18, May 4, 1987, pp. 1888–1890.
Hosoya et al., "High-Tc Superconductivity in New Oxide Systems" Jpn. J. Appl. Phys. 26(1987)L 325–326.
Kitazawa et al., "Superconductivity at 95K in the New Yb-Ba-Cu-O Oxide System" Jpn. J. Appl. Phys. 26(1987)L 339–341.
Koinuma et al., "High Tc Superconductivity in Screen Printed Yb-Ba-Cu-O Films" Jpn. J. Appl. Phys. 26(1987)L 761–762.
Kawazaki et al., "High Tc Yb-Ba-Cu-O Thin Films Deposited on Sintered YSZ Substrates by Sputtering" Jpn. J. Appl. Phys. 26(1987)L 738–740.
S. Y. Lee "Microprobe Characterization of Sputtered High Tc Superconductivity Films on Si and $SiTiO_3$" Abstract—American Vac. Society Nov. 2, 1987.
Hammond et al., "Superconducting Thin Films of the Perovskite Super-Conductors by Electron-Beam Deposition" MRS proc. sym. Apr. 23/87; pp. 169–171.
Gurvitch et al., "Preparation and Substrate Reactions of Superconducting Y-Ba-Cu-O Films" Appl. Phys. Lett. 51(13) Sep. 1987, pp. 1027–1029.
S. J. Lee et al., "Preparation of Y-Ba-Cu-O Thin Films on MgO by DC Magnetron Sputtering from a Stoichiometric $Y_1Ba_2Cu_3O_{7-\delta}$ target" Appl. Phys. Lett. 51(15) Oct. 1987, pp. 1194–1196.
Davison et al., "High Tc Superconducting Films from Metallo-Organic Precursors" MRS, vol. 99, Nov. 1987, pp. 289–292.
Venkatesan "Laser Deposited High Tc Superconducting Thin Films" Solid State Technology, Dec. 1987, pp. 39–41.

*Primary Examiner*—Norman Morgenstern
*Assistant Examiner*—Roy V. King
*Attorney, Agent, or Firm*—Robert J. Wallace

[57] ABSTRACT

A superconducting $Yb_1Ba_2Cu_4O_z$ thin film is formed by a metalorganic deposition method which comprises depositing a solution comprising neodecanoates of Yb, Ba and Cu and a solvent having at least approximately 10 volume percent pyridine in xylene onto a substrate selected from the group consisting of strontium titanate, barium titante, and sapphire; pyrolyzing the coated substrate to thermally decompose the neodecanoates at a temperature of about 500° C. followed by a rapid thermal annealing.

3 Claims, No Drawings

METALORGANIC DEPOSITION OF SUPERCONDUCTING YB-BA-CU-O THIN FILMS BY RAPID THERMAL ANNEALING

This application is related to the copending United States Patent applications, entitled "Metalorganic Deposition of Superconducting Eu-Ba-Cu-O Thin Films by Rapid Thermal Annealing", Ser. No. 136,577, filed Dec. 22, 1987 and herein incorporated by reference, and "Metalorganic Deposition of Superconducting Oxide Thin Films by Rapid Thermal Annealing ", Ser. No. 186,627, filed on the same day as the present application and herein incorporated by reference. The latter application is a continuation-in-part application Ser. No. 103,245, filed Sept. 30, 1987, now abandoned.

This invention relates to superconductors and methods of making films of superconductor materials.

BACKGROUND OF THE INVENTION

Since the first report of a material having a superconducting transition temperature of about 40° K, there has been extensive activity in the field to develop materials having an even higher range of superconducting transition temperatures. A wide variety of superconductor materials having high transition temperatures have been reported, including superconducting materials comprising yttrium, barium, and copper which have transition temperatures greater than about 80oK. Thin film superconductors based upon these yttrium, barium, and copper compounds have been prepared by sputtering, E-beam and laser evaporation, all techniques requiring vacuum processing. As new materials with ever increasing transition temperatures are sought and developed, it is desirable to have a means for preparing thin films of these superconducting materials which uses non-vacuum techniques, permits easy alteration of chemical components, and is compatible with other film processing techniques.

Metallo-Organic Deposition (MOD) is an entirely nonvacuum method of film deposition. Typically, a liquid solution of organic compounds is prepared by dissolution of the organic compounds in a suitable solvent. This solution is then applied much in the same manner as photo-resist, as by spin coating the organic solution onto a selected substrate material. The soft metallo-organic film is then heated in air or oxygen to burn out the organic components and produce a thin film. By utilizing non-vacuum processing techniques, the Metallo-Organic Deposition method provides an economical means for film preparation of semiconductor materials. In addition, the ease in which compounds of a variety of elements can be made allows a wide range of multi-metal compounds to be prepared.

SUMMARY OF THE INVENTION

It is an object of the present invention to provide superconductor films, particularly a superconductor film comprising the rare earth metal ytterbium.

It is a further object of this invention to provide a method for forming films of superconductor materials.

It is still a further object of this invention that these superconductor films be formed in a non-vacuum, air environment.

In accordance with a preferred embodiment of this invention, these and other objects and advantages are accomplished as follows.

We have prepared for the first time thin film superconductors in a non-vacuum, air environment using metallo-organic deposition techniques. Superconducting thin films, comprising barium, copper, and a rare earth (RE) metal, were formed on single crystal strontium titanate substrates by the thermal decomposition of an ink forming solution of the neodecanoates of the barium, copper, and rare earth metal. The preferred rare earth metals include yttrium, ytterbium, and europium.

An ink forming solution is prepared containing the neodecanoates of the barium, copper, and ytterbium. Preferentially, the ink contains about 1 gram of the combined metal neodecanoates to about 1 milliliter of solvent. An ink of the preferred composition was spun onto the strontium titanate substrate at about 2000 revolutions per minute. The spun on ink was dried in air at about 110° C. for about five minutes, then immediately placed into a furnace set at 500° C. and baked in air at this temperature for about five minutes so as to decompose the metal neodecanoates leaving only a metal oxide film on the substrate surface. It is preferred that the freshly prepared inks not set at ambient conditions for too long. The film was then rapid thermal annealed at about 920° C. in an oxygen-containing atmosphere for an amount of time ranging between instantaneously up to about 2 minutes, and subsequently rapidly quenched to room temperature.

Rutherford Backscattering Spectrometry was used to determine that the resulting film's empirical composition prepared in accordance with this method was approximately $Yb_1Ba_2Cu_4O_z$. This method may be employed to produce superconducting films of the rare earth (RE) metals having a general empirical composition of approximately $RE_1Ba_2Cu_4O_z$, and wherein the rare earth metal is chosen from the group consisting of yttrium, ytterbium, europium, or a yttrium/europium combination.

A superconducting film prepared in accordance with this method, comprising ytterbium and having an approximate empirical composition $Yb_1Ba_2Cu_4O_z$, is characterized by a zero state resistance temperature of about 84K and a superconducting transition temperature of about 90K. A superconducting film prepared in accordance with this method, comprising europium and having an approximate empirical composition $Eu_1Ba_2Cu_4O_z$, exhibited a zero state resistance temperature of about 20K and a superconducting transition temperature of about 70K. Electrical measurements show a zero state resistance temperature of about 70K for a superconducting film $Y_1Ba_2Cu_4O_z$, and a superconducting transition temperature of about 90K.

The inventors are the first to employ non-vacuum techniques and achieve thin film superconductors.

Other objects and advantages of this invention will be better appreciated from a detailed description thereof, which follows.

DETAILED DESCRIPTION OF THE INVENTION

The inventors are the first to achieve thin film superconductors using an entirely non-vacuum method. In the present invention, metallo-organic inks are prepared using carboxylates of a rare earth (RE) metal, barium, and copper. The preferred carboxylates are the neodecanoates of the various metals. The preferred rare earth metals are yttrium, ytterbium, and europium. Rutherford Backscattering Spectrometry analysis was used to determine film composition and thickness. Using this technique, the composition of the inks may be adjusted to obtain desired superconducting compositions.

The Rutherford Backscattering Spectrometry analysis revealed that the relative metal composition of the preferred thin films were approximately $RE_1Ba_2Cu_4O_z$, with z ranging between 6–8, and the rare earth (RE) metal comprising yttrium, ytterbium, europium, or a ytterbium/europium combination. Using Rutherford Backscattering Spectrometry, the relative compositions for the ytterbium comprising films and the europium comprising films could not be determined precisely, since the relatively heavy atomic weight of ytterbium and europium prevented the accurate detection of these metals, as the heavy metals were not entirely distinguishable from the barium in the composition. In addition, the concentration of oxygen in the thin films could not be determined precisely from the Rutherford Backscattering Spectrometry spectrum because the oxygen signal from the sapphire substrate on which the thin film coatings were formed overlapped that of the oxygen signal from the superconducting thin films. It is believed that in the empirical formula $RE_1Ba_2Cu_4O_z$, z ranges between about 6 to about 8, as this corresponds to the metal ratios and results in superconductive characteristics.

The usual solvent for the metal neodecanoates is xylene, however it was observed that the yttrium, ytterbium, and europium neodecanoates gel in xylene forming an unusable ink. It was found that the addition of approximately about 5 to about 10 percent pyridine by volume to the xylene forms a solvent that will not gel these neodecanoates. In addition, it was observed that the addition of the pyridine in two separate steps forms superior metallo-organic inks. First, the barium, copper, and rare earth neodecanoates are dissolved by stirring the neodecanoates in a 95% xylene and 5% pyridine solvent for approximately ten hours at room temperature. An additional amount of pyridine, about 1 to about 5 percent, is subsequently added to the metallo-organic ink after the first stirring step and the ink is further stirred for approximately one hour. Formation of a solution of the metal neodecanoates ensures intimate mixing between the elements of the solution which will ultimately for the superconducting compound.

Inks prepared using this method are spun on smooth strontium titanate substrates and then fired to decompose the neodecanoates within the metallo-organic ink. The method of firing the ink onto the substrate is critical, in that thermogravimetric analysis shows that the metal neodecanoates of the rare earth metal, the copper and the barium volatilize and decompose at different temperatures. It was determined that the freshly prepared metallo-organic inks, which have been spun onto the substrates, should be immediately placed in a furnace preheated to about 500° C. This step results in quality thin films of the superconducting composition. After the firing step an oxide film of the appropriate metal oxide composition remains on the substrate, the relative amounts of the metal remaining on the surface reliably corresponds to the amount of metal in the original inks. Using this method, the composition of the metallo-organic inks may be adjusted to obtain various compositions in the oxide films.

The ink is carefully poured onto the top surface of a stationary strontium titanate substrate, so as to flood the surface. The substrates are about one centimeter square by about 0.15 centimeter height, oriented in the <100> crystal direction. The viscous metallo-organic inks are spun onto the substrate surface at various speeds. At 20 seconds at about 2000 revolutions per minute (RPM), the thickness of the ink after drying at about 85° C. so as to evaporate any solvent will be about 4.4 micrometers, and the thickness of the metal oxide film after heating to about 500° C. so as to decompose the neodecanoates will be about 2600 Angstroms. At 20 seconds at 3000 RPM the thickness after drying at 85° C. will be about 3.7 micrometers and the thickness after heating at about 500° C. will be about 2100 Angstroms. At about 20 seconds at 4000 RPM the corresponding thicknesses after drying at 85° C. and heating at 500° C. are about 3.1 micrometers and 2090 Angstroms. At about 20 seconds at 7000 RPM the corresponding thicknesses after drying at 85° C. and heating at 500° C. are about 2.6 micrometers and 1700 Angstroms. These measurements were determined using a step profile detector.

This two step sequence of first spinning the metallo-organic ink onto the substrate followed immediately by the firing at a temperature sufficient to decompose the metal neodecanoates, may be repeated so as to produce films having a thickness of up to about 2.0 micrometers. These films may be processed, by employing multiple deposition techniques in accordance with this invention, to result in thicker or thinner films for optimal superconducting characteristics.

After repeating the spinning and firing sequence sufficiently so as to achieve the desired metal oxide thickness on the substrate, the films are then annealed in a non-vacuum oxygen containing environment at atmospheric pressure and a sufficient temperature for a sufficient duration to promote recrystallization and grain growth within the metal oxides. The resulting films are characterized by superconductive electrical properties. It is preferred that the metal oxide films be rapid thermal annealed, i.e., exposed to the annealing temperature for a relatively short duration, from an instantaneous amount of time up to about 2 minutes. It has been determined that the use of rapid thermal annealing techniques produce superconducting films characterized by higher zero state resistance temperatures than the superconducting films which are conventionally annealed by baking at the desired temperature for a longer duration, i.e., about 6 hours.

Rapid thermal annealing techniques raise the temperature of the substrate and deposited film uniformly and almost instantaneously to the desired annealing temperature. Two methods are generally employed for rapid thermal annealing. The first method, which is the method we prefer, comprises heating the material using quartz lamps. The quartz lamps generate extremely large dosages of electromagnetic infrared radiation in the form of light. The substrates and films are heated very rapidly by exposing the substrates to the quartz lamps and electromagnetic radiation. The second method involves placing the substrates and films on a graphite receptacle and exposing the substrates to microwaves. The microwaves impinge the films deposited on the surface of the substrate and heat the film and substrate uniformly and quickly.

We are the first to produce superconducting thin films using entirely non-vacuum techniques. Superconducting films comprising the rare earth metal, ytterbium, and having an empirical composition of $Yb_1Ba_2Cu_4O_z$, were produced using this metallo-organic deposition method. A metallo-organic ink was prepared using the neodecanoates of ytterbium, barium, and copper. Metallo-organics of the ytterbium and the barium neodecanoates were formed from their metal acetates by reaction with ammonium neodecanoate. The copper metallo-organic was formed by a reaction of copper (II) acetate with tetramethyl ammonium neodecanoate. The metal neodecanoates were dissolved in a solvent solution containing approximately 5 volume percent pyridine in xylene, and stirred for approximately 10 hours. An additional 1-5 volume percent pyridine was added to the solution and stirred for about another hour. Solutions containing the ytterbium, barium, and copper neodecanoates, of various concentrations, may be made by dissolving the three components in appropriate amounts of xylene and pyridine.

The ytterbium comprising solution, i.e., ink, which resulted in the superconductor film composition of $Yb_1Ba_2Cu_4O_z$, has an approximate ratio of about one gram of the combined metal neodecanoates to about one milliliter of solvent. Approximately 16.62 grams of the ytterbium neodecanoate, 19.12 grams of the barium neodecanoate, and 13.76 grams of the copper neodecanoate, yielding a total of about 49.50 grams of metal neodecanoate, were dissolved in about 49.50 milliliters of solvent, the solvent comprising about 47.02 milliliters of xylene with about 2.48 milliliters of pyridine. The ink was stirred for approximately 10 hours at room temperature. Then, an additional 1 to 5 percent pyridine is added and stirring is continued for approximately another hour. The addition of the pyridine in a two steps followed by the stirring step is preferred and results in a superior metallo-organic ink for purposes of preparing the superconducting films. However, suitable results are obtained when the pyridine is added in a single step also. The solutions were viscous having a viscosity of approximately about 14 centipoise and were filtered, using Teflon membranes, to remove particles down to approximately 200 nanometers in size.

The inks prepared from the ytterbium, barium, and copper neodecanoates and solvents were flooded onto stationary single crystal strontium titanate, $SrTiO_3$, substrates of about one centimeter width by about one centimeter length by about 0.15 centimeter height, oriented in the <100> crystal direction. The inks were spun dry on the substrates at various speeds, about 2000 revolutions per minute for about 20 seconds, being preferred. The spun-on inks were dried in air at about 110° C. for about five minutes, then immediately placed in a furnace preheated to about 500° C. The thin film inks were heated in air at that temperature, 500° C., for about 5 minutes to decompose the ytterbium, barium, and copper neodecanoates. This two step, spin-on and fire, deposition sequence was typically repeated multiple times to obtain a desired thickness between about 1.5 and 2.0 microns, however multiple depositions are not required. It is foreseeable that suitable results may be obtained at film thicknesses as small as about 0.1 microns.

Thermogravimetric analysis shows that the metal neodecanoates volatize and decompose at different temperatures. Complete decomposition of the combined ytterbium, barium, and copper neodecanoates used in this invention occurs at about 450° C., leaving only the ytterbium, barium, and copper oxides remaining on the strontium titanate substrate in amounts proportional to the amount of metal in the original metallo-organic ink. The inventors found that if the dried inks on the substrates are immediately placed in a furnace set at about 500° C., after the drying step at about 110° C., quality thin films of the superconducting composition are made for purposes of preparing superconducting films. The grain sizes of the superconducting thin films prepared in accordance with this invention, using metallo-organic deposition techniques, are estimated to be about 250 nanometers in diameter.

After obtaining the desired thickness of the ink and completing the subsequent firing required to decompose the organic neodecanoates and leave only the metal oxides remaining on the substrate, the samples were annealed in a non-vacuum, oxygen containing environment to promote recrystallization and grain growth within the material. Preferably, the films were rapid thermal annealed at about 920° C. in an oxygen-containing atmosphere at atmospheric pressure for an instantaneous amount of time up to about 2 minutes and rapidly quenched to room temperature. The resulting films of $Yb_1Ba_2Cu_4O_z$, prepared in accordance with this method, exhibit superconductive characteristics.

A ytterbium comprising film having the approximate empirical composition $Yb_1Ba_2Cu_4O_z$, as determined by Rutherford Backscattering Spectrometry, was prepared in accordance with the above described metallo-organic deposition method and rapid thermal annealed in pure oxygen first at a temperature of about 850° C. for about 45 seconds and subsequently at a second temperature of about 920° C. for about 30 seconds, and then, quenched in air to room temperature. Silver paint was used to make four probe resistance measurements. A zero point resistance temperature of about 84K was measured. Zero point resistance temperature being defined as that temperature which corresponds to a resistivity limit set at $7.6 \times 10^{-8}$ ohms per centimeter. The room temperature resistivity was approximately $1.2 \times 10^{-3}$ ohms per centimeter. This material is further characterized by a superconducting transition temperature of at least about 90K, where a rapid drop in resistance was observed. X-ray analysis revealed that the superconducting grains within the films were epitaxial with the c-axis perpendicular to the <100> strontium titanate substrate, an orientation which enhances the current carrying capacity of the films.

Although the $Yb_1Ba_2Cu_4O_z$ film, was rapid thermal annealed at a first temperature of about 850° C. for about 45 seconds and followed by rapid thermal annealing at a second temperature of about 920° C. for about 30 seconds, it is believed that this two step rapid thermal annealing step is not required. It is believed that this double annealing step may be beneficial in that the first lower temperature exposure may promote nucleation within the material, while the second higher temperature exposure facilitates incongruent melting within the composition. It is generally known that the presence of the liquid phase greatly enhances grain growth within ceramic materials.

However, a single rapid thermal annealing step at 920° C. for an instantaneous amount of time up to about 2 minutes is believed to be sufficient to produce superconducting films. It is preferred that the material be annealed at a temperature ranging between about 850° C. to about 1000° C. and for a duration of about an instantaneous amount of time up to about 2 minutes, with about 15 seconds to one minute being especially preferred. The duration and annealing temperature are inversely related; i.e, a shorter duration is required at a higher temperature. In addition, suitable results should be obtained using more conventional annealing techniques such as annealing at about 850° C. to about 1000° C. for a sufficient time to promote recrystallization and grain growth.

Superconducting films comprising the rare earth metal, europium, and having an empirical composition of $Eu_1Ba_2Cu_4O_z$, were also produced using this metallo-organic deposition method. The europium comprising superconducting material was rapid thermal annealed at about 930° C. in a pure oxygen environment for about 45 seconds and quenched in air. The material is characterized by a zero point resistance temperature of about 20K and a superconducting transition temperature of about 70K.

In addition, superconducting films comprising the rare earth metal, yttrium, and having an empirical composition of $Y_1Ba_2Cu_4O_z$, were produced using this metallo-organic deposition method. The yttrium comprising superconducting material was rapid thermal annealed at about 920° C. for about 1 minute in a pure oxygen environment and quenched in air. The material is characterized by a zero point resistance temperature of about 70K and a superconducting transition temperature of at least about 90K. Materials of the same composition were also prepared by annealing at 850° C. for about 6 hours and slow cooling to room temperature. These materials were characterized by superconducting transition temperatures which were slightly lower than the materials which were rapid thermal annealed and air quenched.

It is believed that the empirical composition for the superconducting europium comprising films is approximately $Yb_1Ba_2Cu_4O_z$, Rutherford Backscattering Analysis was employed to determine the empirical composition, however due to the weight of the ytterbium, it was difficult to distinguish the ytterbium from the barium during the analysis. This also occurred during the analysis of the europium comprising superconducting material. It is believed that the superconducting characteristics of the ytterbium and europium comprising films may be optimized upon better analysis of the chemical composition of the material.

It is further believed that superconducting films comprising both europium and ytterbium having an empirical composition of $Eu_{0.5}Yb_{0.5}Ba_2Cu_4O_z$, may also be produced in accordance with this method for metallo-organic deposition and rapid thermal annealing. A metallo-organic ink comprising the appropriate amounts of the metal neodecanoates of europium, ytterbium, barium, and copper dissolved in the appropriate amounts of pyridine in xylene, would be spun-on to the appropriate substrate and fired at a temperature so as to decompose the organic neodecanoates. The substrate and film would then be annealed, preferably using rapid thermal annealing techniques, at the appropriate temperature to promote grain growth and recrystallization. The resulting film should exhibit superconducting properties at elevated temperatures.

In addition, it is believed that superconducting films of lanthanum could also be produced in accordance with the method described above.

The inventors are the first to achieve thin film superconductors using an entirely non-vacuum process. With this invention, superconducting thin films of various compositions comprising a rare earth metal have also been formed on barium titanate and sapphire substrates. Other suitable diffusion and temperature resistant materials may also be used as the substrate. It is also believed that superconducting thin films may be formed, in accordance with this invention, on silicon or silicon oxide substrates if a suitable diffusion barrier layer, such as a strontium titanate layer, is provided between the substrate and metal neodecanoate inks.

This invention readily facilitates modification of the metal constituents and their ratios in the thin films, to obtain optimal superconducting characteristics within the thin films. This invention is also, an entirely non-vacuum process which is compatible with film processing techniques. While our invention has been described in terms of preferred embodiments it is apparent that other forms could be adopted by one skilled in the art without departing from the spirit of the invention, such as annealing the materials be exposing the materials to a focused laser beam or other appropriate materials. Accordingly the scope of our invention is to be limited only by the following claims.

The embodiments of the invention in which an exclusive property or privilege is claimed are defined as follows:

1. A method for producing films of superconductor materials comprising the steps of:
    forming a solution from the neodecanoates of ytterbium, barium, and copper metals, said metals form an oxide mixture exhibiting superconductive properties, said solution comprises a solvent having at least approximately 10 volume percent pyridine in xylene;
    depositing a film of said solution onto a substrate, said substrate selected from the group consisting of strontium titanate, barium titanate, and sapphire;
    pyrolyzing said film in an oxygen-containing environment at a first temperature of approximately 500° C. for up to approximately 5 minutes, so as to thermally decompose said neodecanoates of ytterbium, barium and copper into a film containing oxides of ytterbium, barium and copper, said pyrolyzing occurring substantially immediately after said depositing step; and
    heating said oxide film at a second temperature ranging between about 850° C. and 1000° C. for a duration of up to approximately 2 minutes to promote grain growth of said metal oxides within said film and induce a change therein by which said film exhibits superconducting properties at a significantly increased temperature.

2. A method for producing thin film superconductor materials comprising the steps of:
    forming a solution from the neodecanoates of ytterbium, barium, and copper metals, said metals form an oxide mixture exhibiting superconductive properties, said oxide mixture characterized by a ratio of approximately 1:2:4 for said ytterbium, barium and copper metals respectively, said solution comprises a solvent having at least approximately 10 volume percent pyridine in xylene;
    depositing a film of said solution onto a substrate, said substrate selected from the group consisting of strontium titanate, barium titanate, and sapphire;
    pyrolyzing said film in an oxygen-containing environment at a first temperature of about 500° C. for about 5 minutes, so as to decompose said neodecanoates of ytterbium, barium, and copper into a film containing oxides of ytterbium, barium, and copper, said pyrolyzing occurring substantially immediately after said depositing step; and
    heating said metal oxide film at a second temperature of about 920° C. for a duration of approximately 2 minutes to promote grain growth of said metal oxides within said film and induce a change therein by which said film exhibits superconducting properties at a significantly increased temperature.

3. A method for producing films of superconductor materials as set forth in claim 2 wherein said resulting superconductive metal oxide film has a thickness ranging between about 0.1 microns to about 2.0 microns.

* * * * *